United States Patent
Gajanayake et al.

(10) Patent No.: US 10,971,927 B2
(45) Date of Patent: Apr. 6, 2021

(54) CURRENT CONTROLLING DEVICE

(71) Applicant: ROLLS-ROYCE plc, London (GB)

(72) Inventors: Chandana J Gajanayake, Singapore (SG); Pradip Chatterjee, Singapore (SG); Michael A Zagrodnik, Singapore (SG)

(73) Assignee: ROLLS-ROYCE plc, London (GB)

( * ) Notice: Subject to any disclaimer, the term of this patent is extended or adjusted under 35 U.S.C. 154(b) by 169 days.

(21) Appl. No.: 16/451,455

(22) Filed: Jun. 25, 2019

(65) Prior Publication Data

US 2020/0014199 A1   Jan. 9, 2020

(30) Foreign Application Priority Data

Jul. 6, 2018 (GB) ..................................... 1811128

(51) Int. Cl.
| | | |
|---|---|---|
| *H02H 9/02* | (2006.01) | |
| *H01F 38/02* | (2006.01) | |
| *H01L 39/20* | (2006.01) | |
| *H02H 9/00* | (2006.01) | |
| *H01F 3/10* | (2006.01) | |

(52) U.S. Cl.
CPC ............ *H02H 9/023* (2013.01); *H02H 9/02* (2013.01); *H02H 9/021* (2013.01); *H01F 3/10* (2013.01); *H01F 38/023* (2013.01); *H01L 39/20* (2013.01); *H02H 9/00* (2013.01)

(58) Field of Classification Search
USPC ........................................ 361/19, 93.5, 93.9
See application file for complete search history.

(56) References Cited

U.S. PATENT DOCUMENTS

| | | | | |
|---|---|---|---|---|
| 5,355,275 A | * | 10/1994 | Goodier ................ | H02H 9/023 |
| | | | | 361/141 |
| 5,930,095 A | * | 7/1999 | Joo ......................... | H01F 6/06 |
| | | | | 361/58 |
| 8,830,647 B2 | | 9/2014 | Chen et al. | |

FOREIGN PATENT DOCUMENTS

| | | |
|---|---|---|
| DE | 860233 C | 12/1952 |
| EP | 2088603 A2 | 8/2009 |
| GB | 642326 A | 8/1950 |
| GB | 1586900 A | 3/1981 |

OTHER PUBLICATIONS

M. Pannu et al.; "Pre-Saturated Core Fault Current Limiter"; Australasian Universities Power Engineering Conference; Oct. 3, 2013; pp. 1-7.
Dec. 11, 2018 Search Report issued in British Patent Application No. 1811128.6.
Nov. 12, 2019 Search Report issued in European Patent Application No. 19181959.8.

\* cited by examiner

*Primary Examiner* — Danny Nguyen
(74) *Attorney, Agent, or Firm* — Oliff PLC

(57) ABSTRACT

There is described a device for controlling an amount of current within a power distribution network by manipulating the amount of magnetic flux in the device and thus the impedance experienced by the power distribution network across the device. This is achieved by winding a plurality of coils about a magnetically permeable core and by providing the device with a magnetically permeable bridge element that is movable between a fully-open position at which the net magnetic flux generated in the core by alternating currents in each coil is zero, and a fully-closed position at which a net magnetic flux is present in the core.

15 Claims, 7 Drawing Sheets

CURRENT CONTROLLING DEVICE

CROSS-REFERENCE TO RELATED APPLICATIONS

This specification is based upon and claims the benefit of priority from UK Patent Application Number 1811128.6 filed on 6 Jul. 2018, the entire contents of which are incorporated herein by reference.

TECHNOLOGICAL FIELD

The technology described herein concerns a current controlling device. In particular, there is described a device for controlling a current in an N-phase power distribution system during a fault condition.

BACKGROUND

Electrical power systems are used to generate and supply electrical power. An example of such a system is an electrical grid that generates and provides power to an extended area. Smaller electrical power systems can also be implemented on aircraft and marine vessels etc.

An electrical power system typically includes a generator set and a power distribution system that feeds the generated power to nearby electronic components of the overall power system. The distribution system typically comprises a plurality of distribution lines for supplying alternating-current (AC) or direct-current (DC) to the electronic components and one or more return lines used as a return path for the current.

A known problem with electrical power systems is that the distribution system can occasionally experience faults, which may be the result of crossed or downed distribution lines, for example. Faults in the distribution system can cause an excessive current (which is to be referred to herein as "overcurrent" or "fault current") to flow through the wider electrical power system, which is particularly problematic to upstream critical loads that often become damaged as a result.

It is known to protect electrical power systems from fault currents by using a device referred to as a fault current limiter (FCL), which limits the fault current without complete disconnection of the current. An FCL typically operates by providing a low impedance at normal current levels but a high impedance during a fault when excessive current levels tend to exist. An FCL is typically in the form of a "superconducting" FCL which is configured such that when a fault develops, its resistance rises sharply (through a process known as "magnet quenching") and the fault current is diverted to a parallel circuit having higher impedance.

A problem in such systems, however, is that they are bulky in size (e.g. in that they have a parallel circuit) and often require servicing and replacement of constituent parts after a fault occurs. Accordingly, it would be desirable to provide a device for controlling a current in an N-phase power distribution system during a fault condition which is less bulky and includes less parts to be replaced after a fault, amongst other things.

BRIEF SUMMARY

According to an aspect of the technology described herein, there is provided a device for controlling a current in an N-phase power distribution system, the device comprising:

a magnetically permeable core forming a loop;

a magnetically permeable bridge element movable between a fully-closed position, at which a magnetically permeable path is provided along the bridge element between a first position on the core and a second position on the core, and a fully-open position, at which a magnetically insulating gap is formed between the first position and the second position on the core;

a plurality of coils wound about the core, wherein each coil is suitable for receiving an alternating current from the power distribution system to generate a time-varying magnetic field in the core;

wherein the plurality of coils are wound about the core such that the alternating current in the plurality of coils will generate time-varying magnetic fields in directions that will provide:

a substantially zero net magnetic flux in the core when the bridge element is in the fully-open position; and a non-zero net magnetic flux in the core when the bridge element is in the fully-closed position;

wherein the device further comprises a controller configured to move the magnetically permeable bridge element between the fully-open position and the fully-closed position to control an amount of net magnetic flux in the core and thereby an impedance to current across the coils.

The technology described herein is concerned with a device suitable for controlling an amount of current within a power distribution network by manipulating the amount of magnetic flux in the device and thus the impedance experienced by the power distribution network across the device. This is achieved by winding a plurality of coils about a magnetically permeable core and by providing the device with a magnetically permeable bridge element that is movable between a fully-open position at which the net magnetic flux generated in the core by alternating currents in each coil is zero, and a fully-closed position at which a net magnetic flux is present in the core.

By controlling the amount of impedance experienced by the power distribution system, the device can be used as a fault current limiter having a simpler and more compact design than prior art arrangements. Furthermore, the ability to control the impedance experienced by current through the device allows greater versatility of operation during normal current modes in that the device can also be used as a differential mode filter, a common mode filter or a variable inductor. This has further size and compactness benefits compared to hypothetical arrangements in which these devices are provided separately.

Furthermore, activating the fault current limiter requires moving the bridge element to a fully closed position. This mechanical response provides faster activation of the fault current limiter in response to detecting that a fault condition exists in the power distribution system. This is particularly true compared to hypothetical fault current limiters that take time to activate, e.g. due to the need for the core to "quench" or become unsaturated. This is advantageous in that the larger fault current would be applied in the main distribution network for a shorter amount of time.

Furthermore, the device provides an impedance to current by utilising the current in the electrical power system itself. This is more practical and economical than hypothetical arrangements in which the fault current limiter requires an external source of power in order to achieve the same result.

The first position on the core may be located on a first side of a coil. The second position on the core may be located on a second side of the coil opposite the first side.

The power distribution network may be a DC power distribution network. The device may further comprise a DC-to-AC inverter to change a DC current from the power distribution network to an AC current to be received by the plurality of coils.

The power distribution network may be a single-phase power distribution network. The plurality of coils may comprise a first coil and a second coil connected in series. The plurality of coils may be wound such that an alternating current in the first coil produces a magnetic field in a first direction around the loop and the same alternating current in the second coil produces a magnetic field in a second, opposite direction to the first direction around the loop.

The plurality of coils may be wound such that a direction of current in the first coil will be in an opposite direction to that of current in the second coil, relative to a circumferential direction around the loop.

The power distribution network may be a multi-phase power distribution network. The plurality of coils may comprise one coil for each phase current of the power distribution system. Each coil may be configured to receive an alternating current from the multi-phase power distribution network that is 360/N degrees out of phase with each other coil of the device.

The bridge element may be configured to be moveable between the open position and the closed position by a mechanical actuator. The mechanical actuator may be a linear actuator. The mechanical actuator may be a rotary actuator.

The controller may be configured to cause the device to limit a current in the power distribution system by moving the bridge element to the fully-closed position in response to detecting that a fault exists in the power distribution system.

The controller may be configured to detect that a fault exists in the power distribution system if a detected current in the power distribution system exceeds a pre-determined threshold current value.

The controller may be configured to operate as a variable inductor, common mode filter or differential mode filter by moving the bridge element to an intermediate position between the fully-open position and the fully-closed position.

The technology described herein extends to a power distribution system having the device as described herein. Accordingly, in an aspect of the technology described herein there is provided an N-phase AC power distribution system having N distribution lines, one distribution line for each phase of the power distribution system, wherein each distribution line is connected to a device according to any of the statements included herein.

The technology described herein also extends to a method of controlling operation of the device of any one of the statements included herein. The method comprises the controller:

operating the device in a passive mode of operation in which the bridge element is held in the fully-open position, such that a substantially zero net magnetic flux is present in the core;
receiving a current measurement indicating the magnitude of a current in the power distribution system;
determining whether a fault exists in the power distribution system based on the received current measurement; and if it is determined that a fault exists in the power distribution system:
switching the device to operate in an active mode of operation by causing the bridge element to be moved to the fully-closed position, such that a net magnetic field is sustained across the core.

Determining whether a fault exists in the power distribution system based on the received current measurement may comprise determining, based on the received current measurement, whether the magnitude of the current in the power distribution system exceeds a pre-determined threshold value. It may be determined that a fault exists in the power distribution system if the magnitude of the current in the power distribution system exceeds the pre-determined threshold current value.

The skilled person will appreciate that except where mutually exclusive, a feature described in relation to any one of the above aspects may be applied mutatis mutandis to any other aspect. Furthermore except where mutually exclusive any feature described herein may be applied to any aspect and/or combined with any other feature described herein.

BRIEF DESCRIPTION

Embodiments will now be described by way of example only, with reference to the Figures, in which.

DETAILED DESCRIPTION

Figure 1:
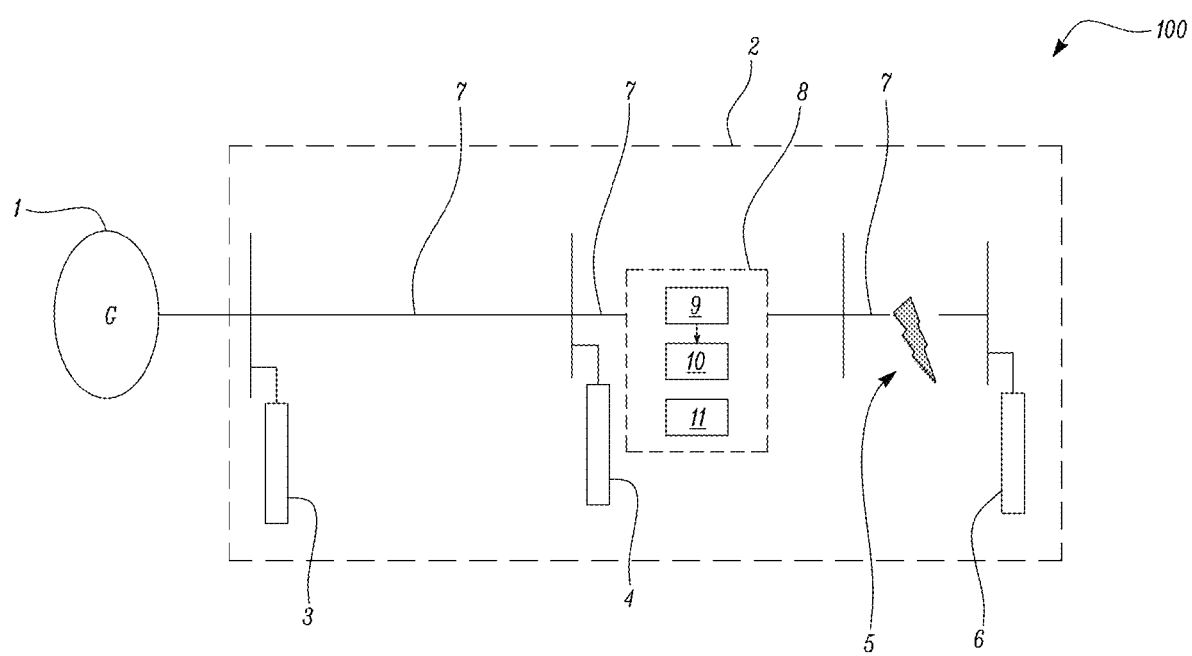
FIG. 1 is a schematic illustration of an electrical power system of the technology described herein.

In the Figures, like reference numerals are used to refer to like features, where appropriate.

With reference to FIG. 1, which is a line diagram of an electrical power system, there is provided an electrical power system 100 which comprises a generator set 1 that produces electrical power and a power distribution system 2 that feeds the power to nearby electronic components of the power distribution system 2.

In the example of FIG. 1, the generator set 1 is driven by a synchronous generator to generate alternating-voltage (AC) for the distribution system 2. However, the generator set 1 may be driven by any suitable rotary drive mechanism, such as a turbine.

The distribution system 2 comprises a distribution line 7 connected in series with the generator set 1 for supplying current to three connected electrical loads, 3, 4, 6 via a distribution bus, and one or more return lines (not shown) used as a return path for the current. Each distribution line 7 corresponds to a single phase of the electrical power system 100. Although not shown, the distribution line 7 is employed with circuit breakers, e.g. fuses etc., which are connected in series to provide protection and breaking isolation capability to different segments of the distribution network 7.

In order to protect the series-connected distribution line 7 and electrical components, such as the circuit breakers, from excessive fault currents in the distribution system 2, a fault current limiter (FCL) 8 is provided in series connection with the distribution line 7 to limit the fault current therethrough. In addition to protecting the distribution line 7 and electrical components, the FCL 8 will protect the electrical loads 3, 4, 6. For example, electrical loads 3, 4 that are upstream of the FCL 8 will be protected from under voltage as a result of excessive currents caused by a fault 5 downstream of the FCL 8, as shown in FIG. 1.

The fault current limiter 8 of the present disclosure includes a controller 9, an actuator 10 and a main body 11 comprising a magnetically permeable core, as will be described further below. The controller 9 is configured to control operation of the fault current limiter 8, particularly the mechanical actuator 10 of the fault current limiter, based on a received current measurement indicating the magnitude of a current in the power distribution system 2.

Figure 7:
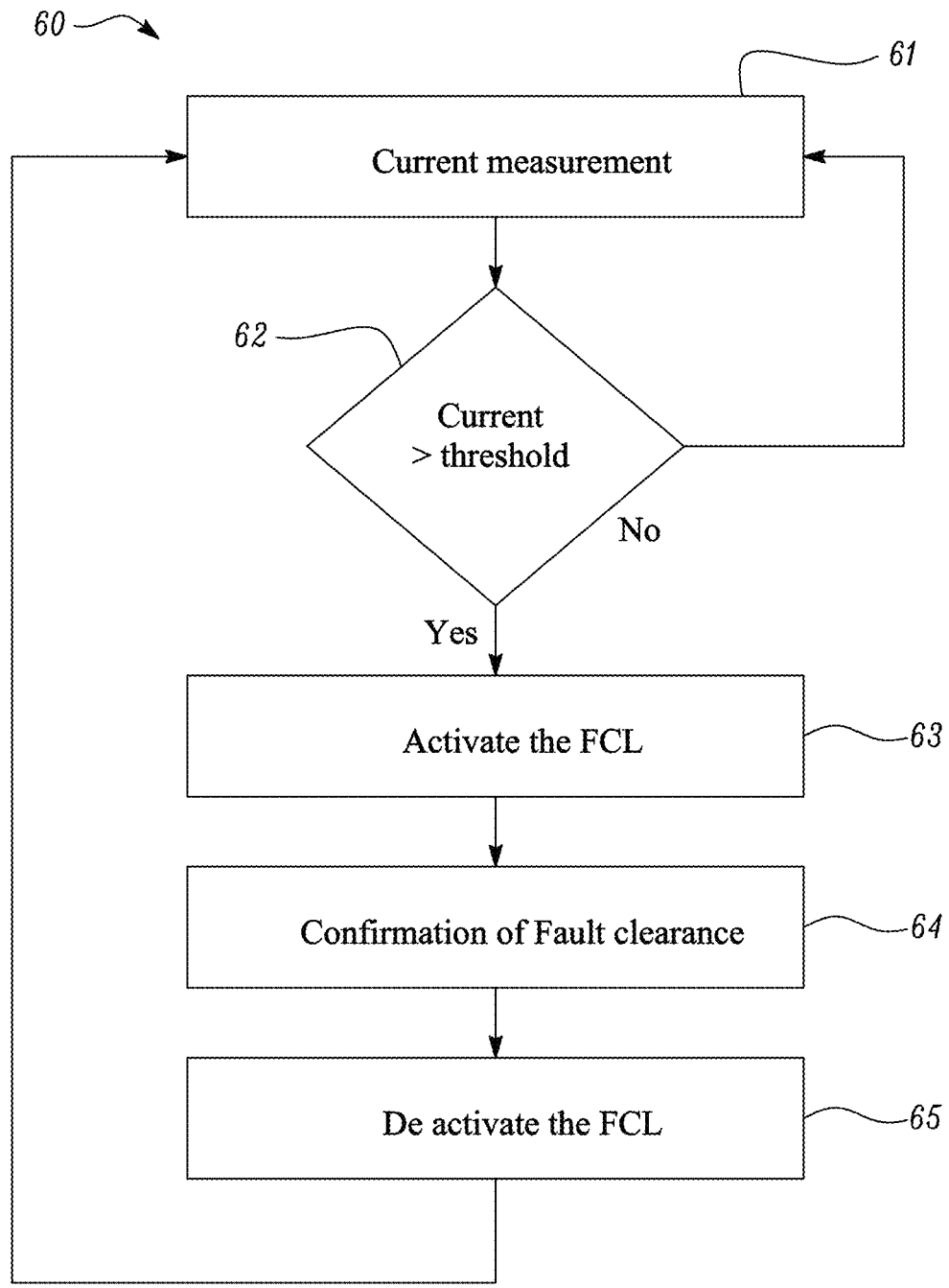
FIG. 7 is a flow chart illustrating the overall operation of the current limiting device when used as a fault current limiter.

The controller 9 may comprise any suitable circuitry to cause performance of the methods described herein and as illustrated in FIG. 7. The controller 9 may comprise: control circuitry; and/or processor circuitry; and/or at least one application specific integrated circuit (ASIC); and/or at least one field programmable gate array (FPGA); and/or single or multi-processor architectures; and/or sequential/parallel architectures; and/or at least one programmable logic controllers (PLCs); and/or at least one microprocessor; and/or at least one microcontroller; and/or a central processing unit (CPU); and/or a graphics processing unit (GPU), to perform the methods.

In various examples, the controller 9 may comprise at least one processor and at least one memory. The memory stores a computer program comprising computer readable instructions that, when read by the processor, causes performance of the methods described herein, and as illustrated in FIG. 7. The computer program may be software or firmware, or may be a combination of software and firmware.

The processor may include at least one microprocessor and may comprise a single core processor, may comprise multiple processor cores (such as a dual core processor or a quad core processor), or may comprise a plurality of processors (at least one of which may comprise multiple processor cores). The memory may be any suitable non-transitory computer readable storage medium, data storage device or devices, and may comprise a hard disk drive and/or a solid state drive. The memory may be permanent non-removable memory, or may be removable memory (such as a universal serial bus (USB) flash drive or a secure digital card). The memory may include: local memory employed during actual execution of the computer program; bulk storage; and cache memories which provide temporary storage of at least some computer readable or computer usable program code to reduce the number of times code may be retrieved from bulk storage during execution of the code.

The computer program may be stored on a non-transitory computer readable storage medium. The computer program may be transferred from the non-transitory computer readable storage medium to the memory. The non-transitory computer readable storage medium may be, for example, a USB flash drive, a secure digital (SD) card, an optical disc (such as a compact disc (CD), a digital versatile disc (DVD) or a Blu-ray disc). In some examples, the computer program may be transferred to the memory via a wireless signal or via a wired signal.

Input/output devices may be coupled to the controller 9 either directly or through intervening input/output controllers. Various communication adaptors may also be coupled to the controller 9 to enable the system to become coupled to other apparatus or remote printers or storage devices through intervening private or public networks. Non-limiting examples include modems and network adaptors of such communication adaptors.

Generally, the FCL 8 operates by providing a low impedance at times when there is not a fault in the distribution system 2, i.e. when the distribution system 2 has current levels within a tolerable range, but a higher impedance at times when there is a fault 5 in the distribution system 2, i.e. when the distribution system 2 experiences excessive current levels. This will now be described further with respect to the embodiments of FIGS. 2 to 6.

Figure 2:
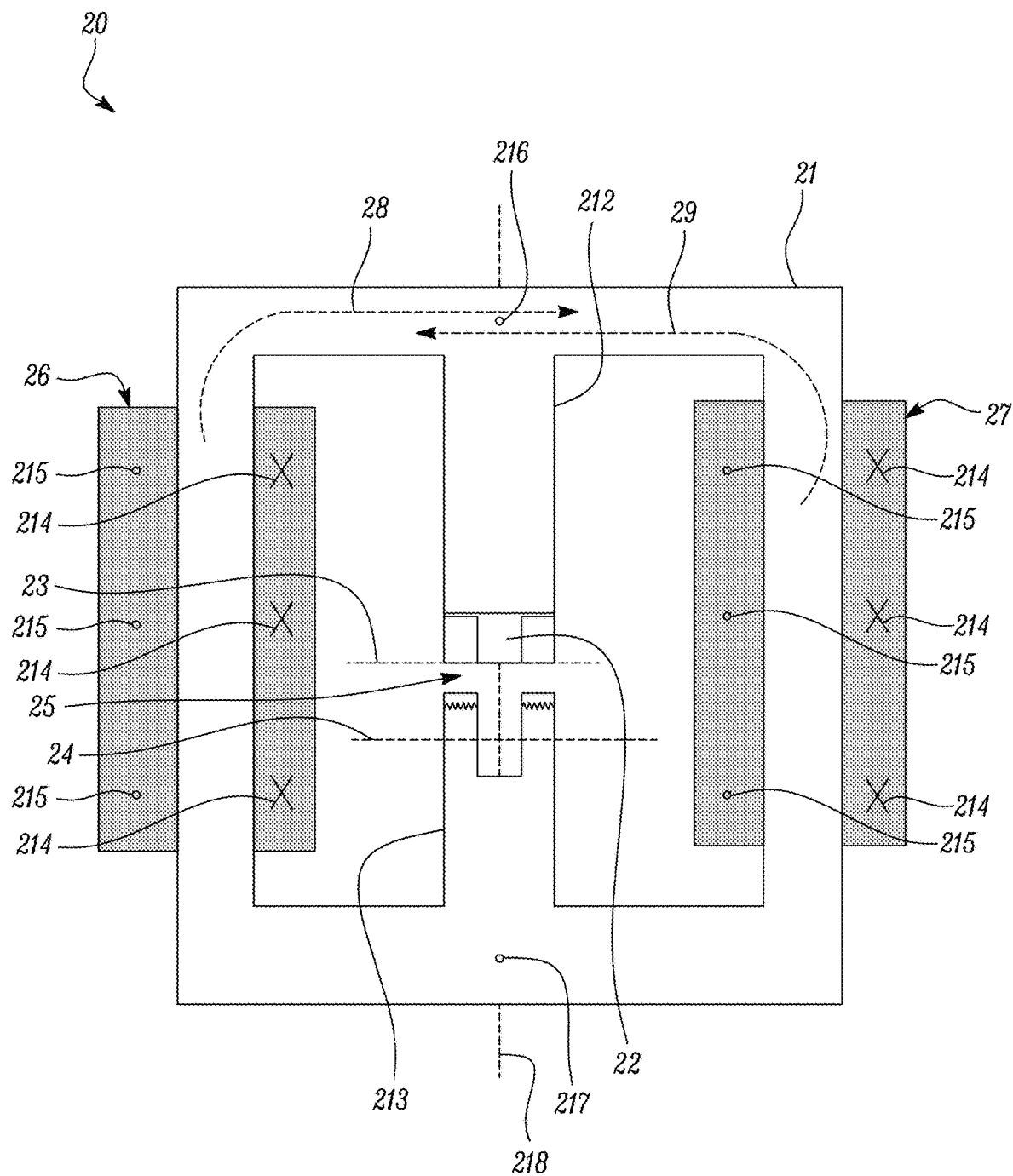
FIG. 2 is a schematic illustration of a current controlling device in the form of a single phase fault current limiter, operating during a passive mode of operation.
Figure 3:
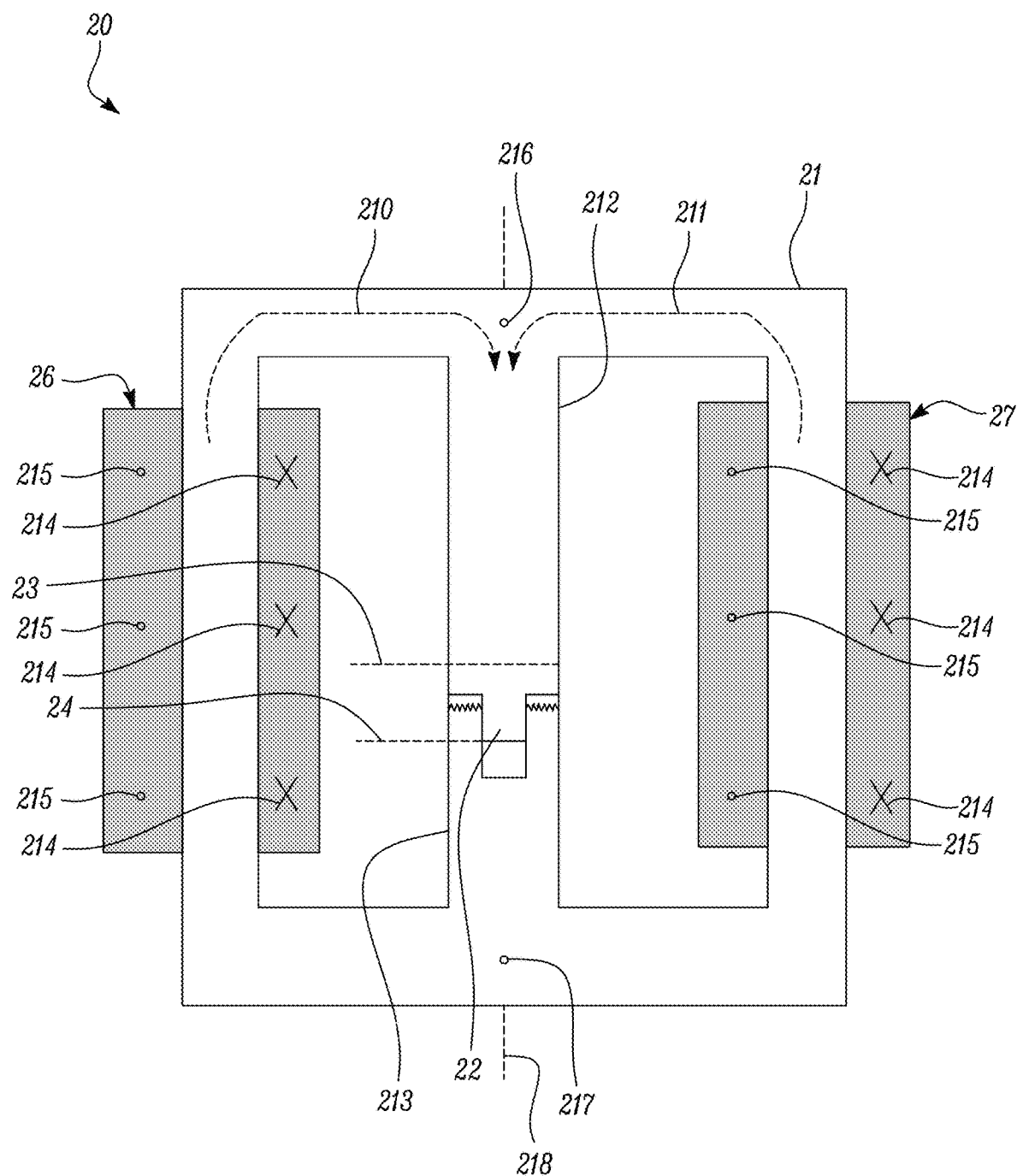
FIG. 3 is a schematic illustration of the current controlling device of FIG. 2, when operating during an active mode of operation.

FIGS. 2 and 3 illustrate a cross section through a single phase fault current limiter 20 which is configured to operate in either a passive or active mode of operation, respectively.

The fault current limiter 20 of FIGS. 2 and 3 comprises a magnetically permeable core 21 forming a closed, i.e. continuous, loop which is generally in the shape of a square (although other shapes would be equally possible). The core 21 may be a ferromagnetic material, such as iron, although any material suitable for supporting a permanent magnetic field may be used.

Wound about the core 21 is a first coil 26 and a second coil 27. Although not shown for ease of illustration, the first coil 26 and the second coil 27 are connected in series with each other and the distribution line 7 of the power distribution system 2 of FIG. 1, such that each coil 26, 27 is configured to receive the same alternating current from the power distribution system 2. In this way, the alternating current through the first coil 26 and the second coil 27 will generate time-varying magnetic fields 28, 29, 210, 211 in the core 21 around the loop.

The core 21 of the fault current limiter 20 comprises two magnetically permeable limbs: a first limb 212 extending from a first position 216 on the core 21 on a first side of the coils 26, 27 between the two coils 26, 27, and a second limb 213 extending from a second position 217 on the core 21 between the two coils 26, 27 on a second side of the coils 26, 27 opposite the first side. The first and second limbs 212, 213 extend towards each other along a centre line 218 of the device 20 between the two coils 26, 27.

As shown in FIGS. 2 and 3, the first limb 212 comprises a magnetically permeable bridge element 22 that is moveable between a fully-open position 23 at which a magnetically insulating gap 25 is formed between the first limb 212 and the second limb 213, and a fully-closed position 24 at which a magnetically permeable path is provided (along the bridge element 22 and the limbs 212, 213) between the first position 216 and the second position 217 on the core 21. In the example of FIGS. 2 and 3, a connection is made between the first limb 212 and the second limb 213 at the fully-closed position to provide the magnetically permeable path. However, it will be appreciated that physical connection between the first limb 212 and the second limb 213 is not required at the fully-closed position. Instead, the fully-closed position may be a position at which a magnetically permeable gap is defined between the first limb 212 and the second limb 213, and the size of the magnetically permeable gap may be set based on the level of inductance required (or desired) during the fault condition.

In the example of FIGS. 2 and 3, the bridge element 22 is moveable between the fully-open position 23 and the fully-closed position 24 by a mechanical actuator, in particular a linear actuator. However, any suitable actuator mechanism may be used to make and correspondingly break the magnetically permeable path along the bridge element 22 and the limbs 212, 213 between the first position 216 and the second position 217 on the core 21. For example, the linear actuation mechanism may comprise a solenoid activated by a separate DC source or a loaded spring mechanism, a release mechanism and/or a fail-safe mechanism, as appropriate.

The movable bridge element 22 shown in FIGS. 2 and 3 is shaped at its distal edge (from position 216 on the loop) to define a tab. The second limb 213 is cooperatively shaped at its distal end (from position 217 on the core 21) to define a corresponding channel to receive the tab when the bridge element is in the closed position 24. The tab and channel are of corresponding depth such that, when the bridge element 22 is in the closed position 24, they are substantially flush with one another to define a magnetically permeable path between the first position 216 and the second position 217 on the loop. The channel and tabs correspond in that they are shaped so that the tab of the moveable bridge element 22 conforms to the shape of the channel of the second limb 213, and vice versa. Although not shown, the second limb 213 may be in the form of an annular structure defining the channel and the bridge element may be a correspondingly shaped cylinder tab or projection.

The two coils 26, 27 are wound such that whenever the same alternating current is present in both coils 26, 27, the alternating current in the first coil 26 and the second coil 27 will produce magnetic fields in directions that oppose one another. In the present example, the two coils 26, 27 are wound such that a direction of the alternating current in the first coil 26 is in an opposite direction to that of the alternating current in the second coil 27, when viewed along the same circumferential direction around the looped core 21.

FIGS. 2 and 3 illustrate these effects for a given direction of alternating current. In particular, FIGS. 2 and 3 show that the two coils 26, 27 are wound about the core 21 such that an alternating current in the first coil 26 produces a magnetic field 28 in a first circumferential direction around the core 21 (loop) and such that the same alternating current in the second coil 27 produces a magnetic field 29 in a second, opposite circumferential direction to the first circumferential direction around the core 21 (loop). The directions of the alternating current through the two coils 26, 27 are illustrated in FIGS. 2 and 3 by crosses 214 and dots 215, where the crosses 214 represent current travelling into the page and the dots 215 represent current travelling out of the page. As can be seen, when viewed along a single circumferential direction about the loop of the core 21 along magnetic field line 29, the direction of current in the first coil 26 is wound in a counter-clockwise direction whereas the direction of current in the second coil 27 is wound in a clockwise direction. Correspondingly, when viewed along a single circumferential direction about the loop of the core 21 along magnetic field line 28, the direction of current in the first coil 26 is wound in a clockwise direction whereas the direction of current in the second coil 27 is wound in a counter-clockwise direction.

As can be seen in FIG. 2, when the moveable bridge element 22 is in the fully-open position 23, the magnetic fields 28, 29 generated by the coils 26, 27 will not be supported across the magnetically insulated gap 25 between the first limb 212 and the second limb 213. As a result, the magnetic fields 28, 29 generated in opposite directions by the alternating current in the coils 26, 27 will be negated such that a substantially zero net magnetic flux is provided in the core.

When the moveable bridge element 22 is in the fully closed position 24, as can be seen in FIG. 3, magnetic fields 210, 211 generated by the coils 26, 27 are supported across the magnetically permeable path along the bridge element 22 between the first position 216 and the second position 217 on the core 21, i.e. along the first limb 212 and the second limb 213. Further, the magnetic fields 210, 211 generated in opposite directions by the alternating current in the coils 26, 27 will be in the same direction along the first limb 212 and the second limb 213 such that the net magnetic field along the bridge element 22 will be a superposition of the magnetic fields 210, 211. As a result, a (non-zero) net magnetic flux is supported in the core 21.

By moving the magnetically permeable bridge element 22 between the fully-open position 23 and the fully-closed position 24, the fault current limiter 20 can be set to operate in either a passive mode of operation during which substantially zero net magnetic flux (and thus impedance) is sustained in core 21 and an active mode of operation during which a net magnetic flux is sustained in the core 21 such that there is an impedance to current across the coils 26, 27.

It will be appreciated that although FIGS. 2 and 3 have been described with respect to a generator set that generates an alternating-current (AC) for the distribution system 2, this is not required. In other arrangements, the generator may produce direct current and the fault current limiter may be connected in series with a DC-to-AC inverter to change a DC current from the power distribution network to an AC current to be received by the plurality of coils.

Furthermore, although FIGS. 2 and 3 show a single fault current limiter 20, there may be one such fault current limiter 20 for each phase of the power distribution system 2, as appropriate.

While the fault current limiter of FIGS. 2 and 3 comprises a core having a single set of co-operating first and second limbs and bridge element, it will be appreciated that the core may have a plurality of such sets of co-operating first and second limbs and bridge elements. The sets may be controlled independently or as a collective unit.

While it has been described above that the bridge element 22 is moveable between the fully-open position 23 and the fully-closed position 24 by a linear actuator mechanism, it will be appreciated that any suitable actuation mechanism may be used instead. For example, the moveable bridge element may be rotary actuated as will now be described with respect to FIG. 4.

Figure 4:
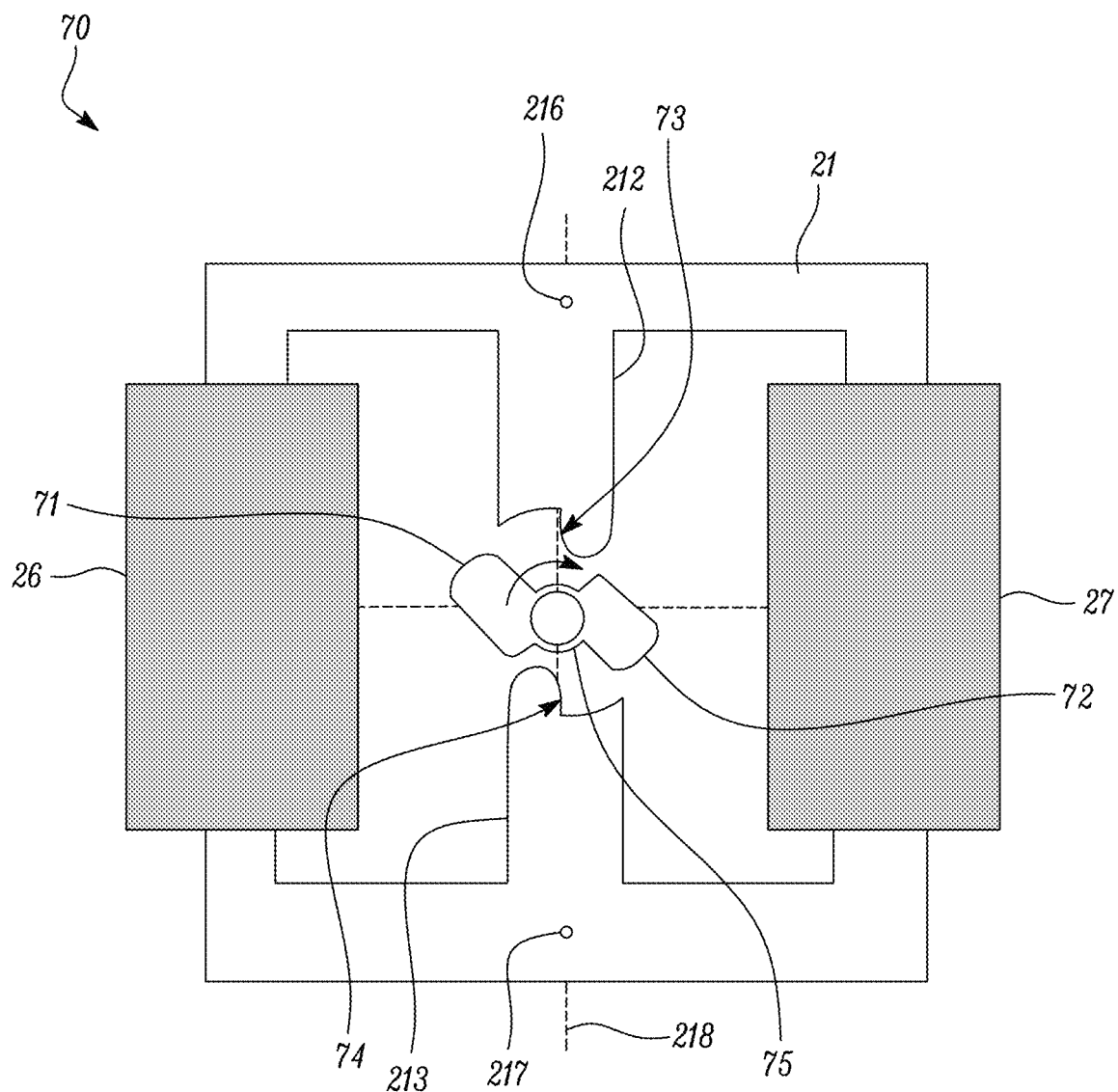
FIG. 4 is a schematic illustration of a current controlling device in the form of a single phase fault current limiter, having a rotating bridge element.

FIG. 4 schematically illustrates a single phase fault current limiter 70 having features that correspond to those described with respect to the device of FIGS. 2 and 3. For example, the fault current limiter 70 of FIG. 4 comprises a magnetically permeable core 21 forming a closed loop and first and second coils 26, 27 wound about the core 21. However, the fault current limiter 70 of this example differs from that of FIGS. 2 and 3 in that the moveable bridge element is configured to be driven by a rotary actuator mechanism.

As can be seen in FIG. 4, the moveable bridge element comprises a body 75 rotatably mounted on a pivot 76. The body 75 comprises a first tab 71 and a second tab 72 each extending away from the body 75 in substantially parallel yet opposing directions. The first limb 212 is shaped at its distal end (with respect to point 216) to define a first recess 73 and the second limb 213 is shaped at its distal end (with respect to point 217) to define a second recess 74.

The moveable bridge element is configured such that when the bridge element is in the fully-closed position, the first tab 71 engages and is received by the first recess 73 of the first limb 212 and the second tab 72 engages and is received by the second recess 74 of the second limb 213. The tabs and recesses are of corresponding lengths such that, when the bridge element is in the fully-closed position, they are substantially flush with one another to define a magnetically permeable path between the first position 216 and the second position 217. The tabs and recesses also correspond in that they are shaped so that a tab 71, 72 of the moveable bridge element conforms to the shape of a recess 73, 74, and vice versa.

Any suitable rotary actuator mechanism may be used to make and correspondingly break the engagement between the tabs 71, 72 and corresponding recesses 73, 74. For example, the rotary actuator may comprise a motor or a torsional spring arrangement. The mechanism may also comprise one or more holding and damping arrangements to avoid excessive impulse force, a locking/release mechanism and/or fail safe mechanisms, as appropriate.

According to other embodiments of the technology described herein, there is provided a single fault current limiter that is suitable for limiting the fault current in a multi-phase system. Such a fault current limiter will now be described with respect to FIGS. 5 and 6.

Figure 5:
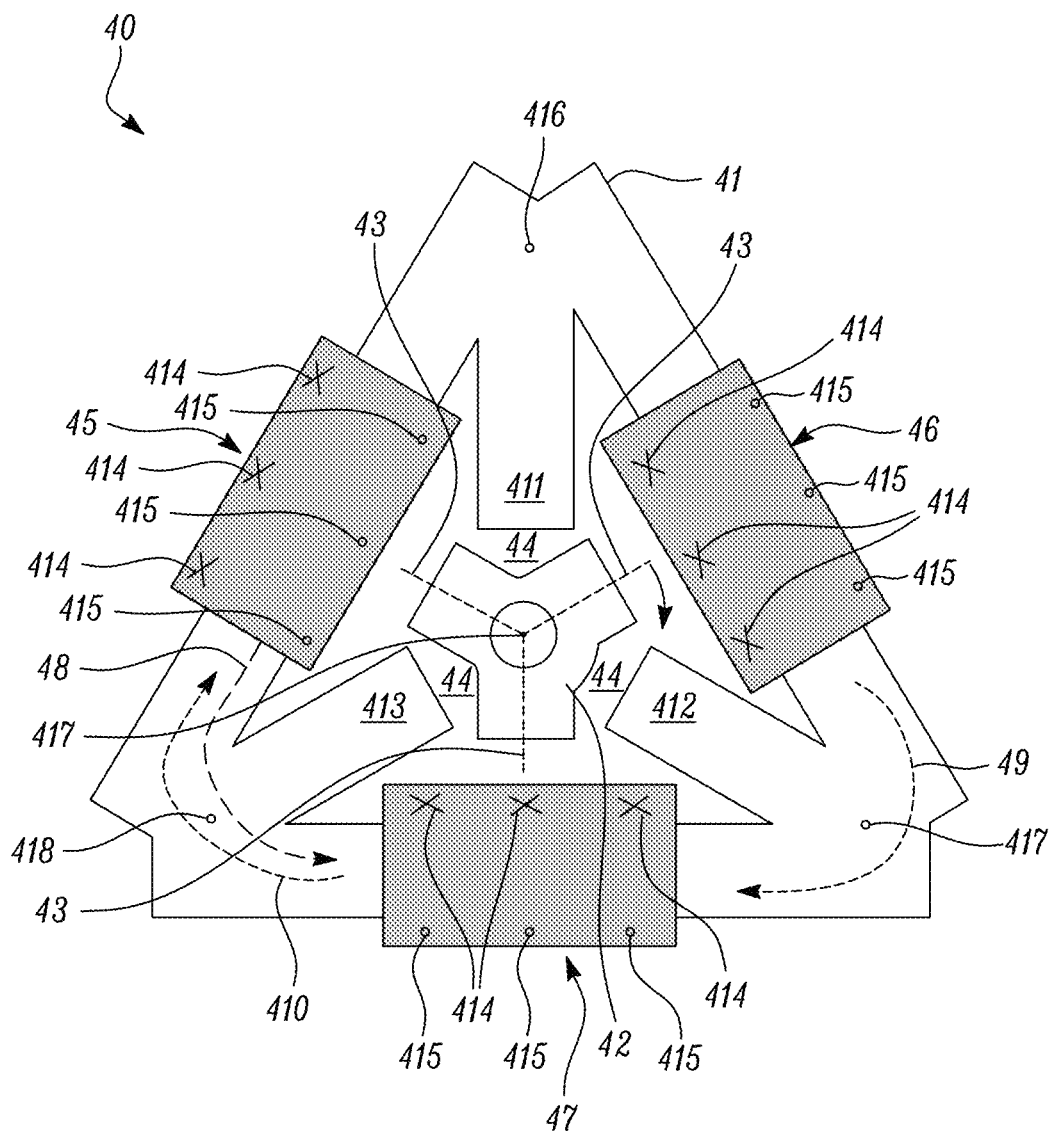
FIG. 5 is a schematic illustration of a current controlling device in the form of a three-phase fault current limiter, operating during a passive mode of operation.
Figure 6:
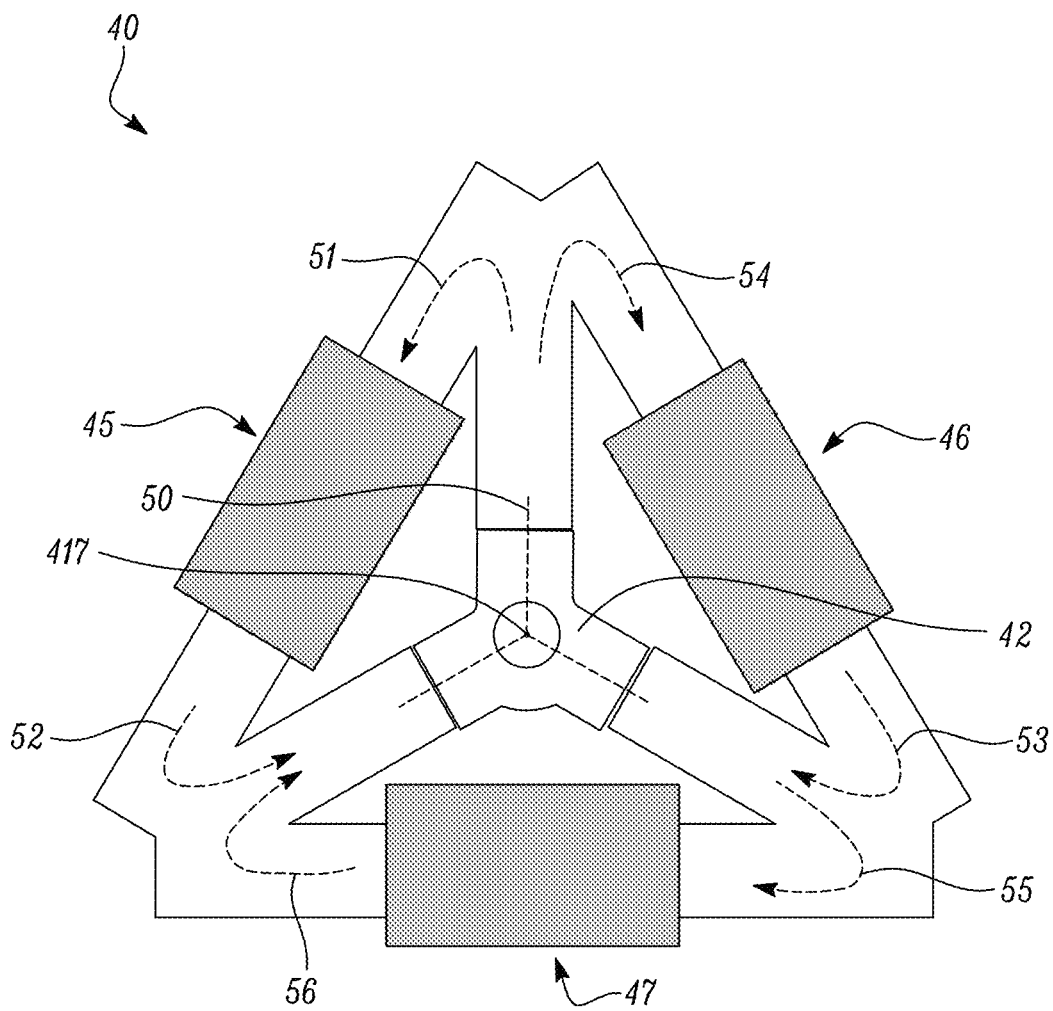
FIG. 6 is a schematic illustration of the current controlling device of FIG. 5, when operating during an active mode of operation.

FIGS. 5 and 6 schematically show a three-phase fault current limiter 40 configured to operate during a passive mode of operation and an active mode of operation, respectively.

The fault current limiter 40 comprises a magnetically permeable (e.g. iron) core 41 forming a closed loop comprising three arms that are connected to form substantially the shape of a triangle. In other arrangements, the loop may be in the shape of a circle, for example.

The fault current limiter 40 comprises three coils, a first coil 45, a second coil 46 and a third coil 47. Each coil is wound about a respective arm of the looped core 41. Although not shown for ease of illustration, each coil 45, 46, 47 is connected in series with a respective distribution line of the power distribution network, corresponding to a single phase of the three phase system. That is, each coil 45, 46, 47 is configured to receive an alternating current that is one hundred and twenty degrees out of phase with each other coil 45, 46, 47 of the fault current limiter 40. That is, when the current through one of the coils, e.g. the first coil 45, is at a positive maximum amplitude, the current in each of the other two coils, e.g. the second and third coils 46, 47, is at negative half amplitude such that the net amplitude of the currents for all three phases is substantially zero.

The core 41 of the fault current limiter 40 comprises a set of three magnetically permeable limbs: a first limb 411 extending from a first position 416 on the core 41 between the first coil 45 and the second coil 46, a second limb 412 extending from a second position 417 on the core 41 between the second coil 46 and the third coil 47, and a third limb 413 extending from a third position 418 on the core 41 between the third coil 47 and the first coil 45. Each one of the first, second and third positions 416, 417, 418 are substantially equidistant to their two adjacent coils 45, 46, 47. The first, second and third limbs 411, 412, 413 extend toward a centre of the loop, at which point there is located a magnetically permeable bridge element 42.

The magnetically permeable bridge element 42 is rotatable (by a rotary actuator) about an axis 417 between a fully-open position 43 at which a magnetically insulating gap 44 is formed between a respective limb 411, 412, 413 and the bridge element 42 (as shown in FIG. 5), and a fully-closed position 50 at which a connection is made between each limb 411, 412, 413 and the bridge element 42 (as shown in FIG. 6), to provide magnetically permeable paths between the first position 416, the second position 417 and the third position 418 on the core 41 via the bridge element 42.

Any suitable rotary actuator mechanism may be used to make and correspondingly break the magnetically permeable path along the bridge element 42. For example, the rotary actuator may comprise a motor or a torsional spring arrangement. The mechanism may also comprise one or more holding and damping arrangements to avoid overshoots and excessive impulse force, a locking/release mechanism and/or fail safe mechanisms, as appropriate. In other arrangements the bridge element may be linearly actuated. The (linear or rotary) actuation mechanism can be driven by an electrical source, electro mechanical source or any other source as appropriate.

The movable bridge element 42 shown in FIGS. 5 and 6 is shaped to define three tabs each extending in a straight line from the axis 417 at substantially one hundred and twenty degrees relative to each other. The tabs and limbs 411, 412, 413 are of corresponding lengths such that, when the bridge element 42 is in the closed position 50, they are substantially flush with one another to define a magnetically permeable path between the first position 416, the second position 417 and the third position 418. The tabs and limbs 411, 412, 413 correspond in that they are shaped so that a tab of the moveable bridge element 42 conforms to the shape of a corresponding limb 411, 412, 413, and vice versa.

The three coils 45, 46, 47 are wound about the core 41 such that a magnetic field 48 produced by an alternating current in the first coil 45 is substantially negated or cancelled by magnetic fields 49, 410 produced by currents in the second coil 46 and the third coil 47.

FIGS. 5 and 6 illustrate this effect for a given snapshot in time for a three-phase alternating current. In particular, FIGS. 5 and 6 show the device 40 operating at a time when a current through the first coil 45 is at its greatest magnitude in a first direction, but a current through the second coil 46 and a current through the third coil 47 are each at half the maximum magnitude of the current in the first coil 45 and flow in a second, opposite direction to the first direction.

The directions of the current through the coils 45, 46, 47 are illustrated in FIG. 5 by crosses 414 and dots 415, where the crosses 414 represent current travelling into the page and the dots 415 represent current travelling out of the page. As can be seen, when viewed along a single circumferential direction about the loop of the core 41 along magnetic field line 48, the current in the first coil 45 flows in a clockwise direction whereas the currents in the second coil 46 and the third coil 47 flow in a counter-clockwise direction. Correspondingly, when viewed along a single circumferential direction about the loop of the core 41 along magnetic field line 49, the current in the first coil 45 flows in a counter-clockwise direction whereas the currents in the second coil 46 and the third coil 47 flow in a clockwise direction.

The field 48 produced by the current in the first coil 45 is at its greatest magnitude in a first direction when the fields 49, 410 produced by the currents in the second and third coils 46, 47 will be at half magnitude in the opposite direction. In this way, the field 48 generated by the first coil in the first direction is negated by the fields 49, 410 generated by the second and third coils in the second direction.

When the moveable bridge element 42 is in the fully open position 43, as shown in FIG. 5, the magnetic fields 48, 49, 410 generated by the coils 45, 46, 47 are not supported across the limbs 411, 412, 413 via the bridge element 42 and the direction of the magnetic fields 48, 49, 410 generated by the coils 45, 46, 47 will be negated such that a substantially zero net magnetic flux is provided in the core 41.

When the moveable bridge element 42 is in the fully closed position 50, as shown in FIG. 6, magnetic fields 51, 52, 53, 54, 55, 56 generated by the coils 45, 46, 47 are supported across the limbs 411, 412, 413 via the bridge element 42 such that a (non-zero) net magnetic flux is supported in the core 41.

By moving the magnetically permeable bridge element 42 between the fully-open position 43 and the fully-closed position 50, the fault current limiter 40 can be set to operate in either a passive mode of operation during which substantially zero net magnetic flux (and thus impedance) is sustained in core 41 and an active mode of operation during which a net magnetic flux is sustained in the core 41 such that there is an impedance to current across the coils 45, 46, 47.

The fault current limiter comprises a controller 9 configured to cause the fault current limiter to switch between the passive mode of operation and the active mode of operation by moving the magnetically permeable bridge element between the fully-open position and the fully-closed position. In particular, the controller is configured to cause the fault current limiter to operate in the active mode of operation by moving the bridge element to the fully-closed position in response to detecting that a fault exists in the power distribution system. The controller 9 may be provided as part of the fault current limiter or as a separate entity configured to send appropriate control signalling to the movable bridge element.

FIG. 7 is a flow diagram schematically illustrating operation of a controller 9 used in conjunction with a fault current limiter described above with respect to FIGS. 1 to 6.

The method begins at step 61 with the controller operating in the passive mode of operation where the bridge element is held in the fully-open position, such that substantially zero net magnetic flux is sustained across the core. In this way, an alternating current passing through the coils will experience little impedance and will therefore not be greatly influenced by the fault current limiter.

During the passive mode of operation, the controller receives a current measurement indicating the magnitude of a current in the power distribution system.

At step 62, the controller detects whether a fault exists in the power distribution system based on the received current measurement. This may comprise the controller determining, based on the current measurement, whether the current in the power distribution system exceeds a pre-determined threshold value.

If it is determined at step 62 that the current in the power distribution system does not exceed the pre-determined threshold current value, the controller will return to step 61 and receive an updated current measurements, before repeating step 62 with the updated measurement.

If, however, it is determined at step 62 that the current in the power distribution system exceeds the pre-determined threshold current value, this can be taken as an indication that the electrical power system is experiencing a fault condition and the controller will accordingly activate the fault current limiter by switching to the active mode of operation. In particular, the controller will issue control signaling to cause the bridge element to be moved to (and held at) the fully-closed position, such that a net magnetic field is sustained across the core. During the active mode of operation, alternating current passing through the coils will experience a relatively large impedance compared to the passive mode and will therefore be reduced by the fault current limiter.

The fault current limiter will continue to operate in the active mode of operation until the fault is cleared. After the fault has been cleared the controller will receive confirmation of this at step 64. This may be in the form of a signal or input from a user of the electrical power system, or may be the result of a determination that the current has returned to a level that is below the threshold value, for example.

Once confirmation of fault clearance has been received, the controller will de-activate the fault current limiter at step 65 by issuing a signal that will cause the bridge element to be returned to the fully-open position.

While the present technology has been described above with respect to providing a fault current limiter, it will be appreciated that the technology described herein is applicable more generally to any type of device for controlling a current in a power distribution system. For example, instead of the controller switching between a passive mode of operation and an active mode of operation as described above, the controller may be configured to operate in an intermediate mode of operation, e.g. during normal current levels, by moving the bridge element to an intermediate position between the fully-open position and the fully-closed position. In this way, the technology described herein may be used as a variable inductor, common mode filter or differential mode filter, as will now be described.

The (fault current limiting) device can be used as a variable inductor by varying the position of the bridge element between the fully-open position and the fully-closed position to introduce different common mode and differential mode inductance. Alternatively the device can be used in this way to control the current flow in the power line, both in fault conditions as well as normal current operating conditions.

The (fault current limiting) device can also be used as a variable differential mode inductor by varying the position of the bridge element between the fully-open position and the fully-closed position to introduce different differential mode inductance.

Where the bridge element is driven by a rotary actuation mechanism, the (fault current limiting) device can be used as a variable frequency inductor by varying the speed at which the bridge element is rotated, to vary the inductance across the device.

It will be appreciated that in all of the arrangements described above the core material and dimensions, the location of the magnetically permeable bridge element at the fully-closed position, as well as the number of turns in the plurality of coils, will be set based on the level of inductance required during the fault condition and, e.g. considering the common mode inductance requirements that are needed during the normal operating conditions.

Further, while the core has been described with respect to the drawings as forming a closed, i.e. continuous, loop, this is not required. The loop could instead form an open, i.e. discontinuous or broken, loop. This may be achieved by providing one or more magnetically-permeable gaps in the core.

It will be understood that the technology described herein is not limited to the embodiments above-described and various modifications and improvements can be made without departing from the concepts described herein. Except where mutually exclusive, any of the features may be employed separately or in combination with any other features and the disclosure extends to and includes all combinations and sub-combinations of one or more features described herein.

We claim:

1. A device for controlling a current in an N-phase power distribution system, the device comprising:
 a magnetically permeable core forming a loop;
 a magnetically permeable bridge element movable between a fully-closed position, at which a magnetically permeable path is provided along the bridge element between a first position on the core and a second position on the core, and a fully-open position, at which a magnetically insulating gap is formed between the first position and the second position on the core;
 a plurality of coils wound about the core, wherein each coil is suitable for receiving an alternating current from the power distribution system to generate a time-varying magnetic field in the core;
 wherein the plurality of coils are wound about the core such that the alternating current in the plurality of coils will generate time-varying magnetic fields in directions that will provide:
  a substantially zero net magnetic flux in the core when the bridge element is in the fully-open position; and
  a non-zero net magnetic flux in the core when the bridge element is in the fully-closed position;
 wherein the device further comprises a controller configured to move the magnetically permeable bridge element between the fully-open position and the fully-closed position to control an amount of net magnetic flux in the core and thereby an impedance to current across the coils.

2. The device as claimed in claim 1, wherein the first position on the core is located on a first side of a coil and the second position on the core is located on a second side of the coil opposite the first side.

3. The device as claimed in claim 1, wherein the power distribution network is a DC power distribution network and the device further comprises a DC-to-AC inverter to change a DC current from the power distribution network to an AC current to be received by the plurality of coils.

4. The device as claimed in claim 1, wherein:
 the power distribution network is a single-phase power distribution network;
 the plurality of coils comprise a first coil and a second coil connected in series; and
 the plurality of coils are wound such that an alternating current in the first coil produces a magnetic field in a first direction around the loop and the same alternating current in the second coil produces a magnetic field in a second, opposite direction to the first direction around the loop.

5. The device as claimed in claim 4, wherein the plurality of coils are wound such that a direction of current in the first coil will be in an opposite direction to that of current in the second coil, relative to a circumferential direction around the loop.

6. The device as claimed in claim 1, wherein:
 the power distribution network is a multi-phase power distribution network;
 the plurality of coils comprise one coil for each phase current of the power distribution system; and
 each coil is configured to receive an alternating current from the multi-phase power distribution network that is 360/N degrees out of phase with each other coil of the device.

7. The device as claimed in claim 1, wherein the bridge element is configured to be moveable between the open position and the closed position by a mechanical actuator.

8. The device as claimed in claim 7, wherein the mechanical actuator is a linear actuator.

9. The device as claimed in claim 7, wherein the mechanical actuator is a rotary actuator.

10. The device as claimed in claim 1, wherein the controller is configured to cause the device to limit a current in the power distribution system by moving the bridge element to the fully-closed position in response to detecting that a fault exists in the power distribution system.

11. The device as claimed in claim 10, wherein the controller is configured to detect that a fault exists in the power distribution system if a detected current in the power distribution system exceeds a pre-determined threshold current value.

12. The device as claimed in claim 1, wherein the controller is configured to operate as a variable inductor, common mode filter or differential mode filter by moving the bridge element to an intermediate position between the fully-open position and the fully-closed position.

13. An N-phase AC power distribution system having N distribution lines, one distribution line for each phase of the power distribution system, wherein each distribution line is connected to a device as claimed in claim 1.

14. A method of controlling operation of a device as claimed in claim 1, in use, the method comprising the controller:
 operating the device in a passive mode of operation in which the bridge element is held in the fully-open position, such that a substantially zero net magnetic flux is present in the core;
 receiving a current measurement indicating the magnitude of a current in the power distribution system;
 determining whether a fault exists in the power distribution system based on the received current measurement; and
 if it is determined that a fault exists in the power distribution system:
  switching the device to operate in an active mode of operation by causing the bridge element to be moved to the fully-closed position, such that a net magnetic field is sustained across the core.

15. The method of claim 14, wherein:
 determining whether a fault exists in the power distribution system based on the received current measurement comprises determining, based on the received current measurement, whether the magnitude of the current in the power distribution system exceeds a pre-determined threshold value; and
 it is determined that a fault exists in the power distribution system if the magnitude of the current in the power distribution system exceeds the pre-determined threshold current value.

* * * * *